US010652993B2

(12) United States Patent
Moczygemba

(10) Patent No.: US 10,652,993 B2
(45) Date of Patent: May 12, 2020

(54) THERMOELECTRIC DEVICE COOLING SYSTEM

(71) Applicant: II-VI DELAWARE, INC., Wilmington, DE (US)

(72) Inventor: Joshua E. Moczygemba, Wylie, TX (US)

(73) Assignee: II-VI DELAWARE, INC., Wilmington, DE (US)

( * ) Notice: Subject to any disclaimer, the term of this patent is extended or adjusted under 35 U.S.C. 154(b) by 576 days.

(21) Appl. No.: 14/996,076

(22) Filed: Jan. 14, 2016

(65) Prior Publication Data

US 2017/0027053 A1      Jan. 26, 2017

Related U.S. Application Data

(60) Provisional application No. 62/194,720, filed on Jul. 20, 2015, provisional application No. 62/195,145, filed on Jul. 21, 2015.

(51) Int. Cl.
*H05K 1/02* (2006.01)
*F25B 21/02* (2006.01)
*H05K 3/32* (2006.01)

(52) U.S. Cl.
CPC ......... *H05K 1/0203* (2013.01); *F25B 21/02* (2013.01); *H05K 3/32* (2013.01); *F25B 2321/0252* (2013.01)

(58) Field of Classification Search
CPC ...... F25B 21/02; F25B 21/04; F25B 2321/02; F25B 2321/0212; F25B 2321/0252; F25B 2321/025
See application file for complete search history.

(56) References Cited

U.S. PATENT DOCUMENTS

| 8,087,254 | B2 * | 1/2012 | Arnold | A41D 13/005 |
| | | | | 62/3.2 |
| 8,156,570 | B1 * | 4/2012 | Hockaday | A41D 13/0025 |
| | | | | 2/7 |

(Continued)

FOREIGN PATENT DOCUMENTS

| JP | 2003 322482 | 11/2003 |
| WO | WO 97/14925 | 4/1997 |
| WO | WO 2013/074057 A1 | 5/2013 |

OTHER PUBLICATIONS

PCT Cooperation Treaty, Invitation to Pay Additional Fees and, Where Applicable, Protest Fee Form PCT/ISA/206 and Annex to Form PCT/ISA/206 Communication Relating to the Results of the Partial International Search Received from the International Searching Authority, for International Application No. PCT/US2016/042536, 7 pages, dated Oct. 5, 2016.

(Continued)

*Primary Examiner* — Jianying C Atkisson
*Assistant Examiner* — Jose O Class-Quinones
(74) *Attorney, Agent, or Firm* — Maschoff Brennan

(57) ABSTRACT

A thermoelectric cooling system includes at least one thermoelectric cooling module and an electronic circuit. The at least one thermoelectric cooling module is arranged in at least one zone. The electronic circuit is electrically coupled to at least one of the thermoelectric cooling modules. Each of the thermoelectric cooling modules includes a first plate, a sink, a plurality of thermoelectric elements, and a second plate. The thermoelectric elements are coupled to the first plate and the second plate. The first plate is arranged to be thermally coupled to a first surface. The sink is arranged to be thermally coupled to an environment and is configured to (Continued)

dissipate heat by evaporating a liquid from the sink to the environment. The second plate is arranged to be thermally coupled to the sink.

20 Claims, 9 Drawing Sheets

(56) References Cited

U.S. PATENT DOCUMENTS

| | | |
|---|---|---|
| 8,397,518 B1 | 3/2013 | Vistakula |
| 2003/0097845 A1* | 5/2003 | Saunders ............ A41D 13/005 62/3.3 |
| 2004/0068992 A1* | 4/2004 | Cauchy ................. B60N 3/101 62/3.61 |
| 2007/0068174 A1 | 3/2007 | Johnson et al. |
| 2010/0079952 A1 | 4/2010 | Liang et al. |
| 2010/0107657 A1 | 5/2010 | Vistakula |

OTHER PUBLICATIONS

Joshua E. Moczygemba, Provisional Patent Application, entitled "Thermoelectric Device Cooling System," U.S. Appl. No. 62/194,720, filed Jul. 20, 2015.
Joshua E. Moczygemba, Provisional Patent Application, Entitled "Thermoelectric Device Cooling System," U.S. Appl. No. 62/195,145, filed Jul. 21, 2015.
PCT Patent Cooperation Treaty, Written Opinion of the International Searching Authority, Ref. No. PCT/ISA/220, and International Search Report, Ref. No. PCT/ISA/210, Int'l Appln. No. PCT/US2016/042536, 17 Pages, dated Jul. 20, 2015.

* cited by examiner

THERMOELECTRIC DEVICE COOLING SYSTEM

RELATED APPLICATION

This application claims benefit under 35 U.S.C. § 119(e) of U.S. Provisional Application Ser. No. 62/195,145, titled "Thermoelectric Device Cooling System," filed Jul. 21, 2015, by Joshua E. Moczygemba and U.S. Provisional Application Ser. No. 62/194,720, titled "Thermoelectric Device Cooling System," filed Jul. 20, 2015, by Joshua E. Moczygemba.

TECHNICAL FIELD

This disclosure relates to generally to thermoelectric devices, and more particularly to a thermoelectric device cooling system.

BACKGROUND

The basic theory and operation of thermoelectric devices has been developed for many years. Presently available thermoelectric devices used for cooling typically include an array of thermocouples that operate in accordance with the Peltier effect. Thermoelectric devices may also be used for heating, power generation, and temperature sensing.

Protecting human beings from intense heat caused by, for example, high ambient temperatures or intense physical activity—is significantly important. The accumulation of internal heat can be performance limiting and even life threatening. Existing body-cooling techniques have been unable to produce effective solutions.

SUMMARY

In one embodiment, a thermoelectric cooling system includes at least one thermoelectric cooling module and an electronic circuit. The at least one thermoelectric cooling module is arranged in a at least one zone. The electronic circuit is electrically coupled to at least one of the plurality of thermoelectric cooling modules. Each of the thermoelectric cooling modules comprises a first plate, a sink, a plurality of thermoelectric elements, and a second plate. The thermoelectric elements are coupled to the first plate and the second plate. The first plate is arranged to be thermally coupled to a first surface. The sink is arranged to be thermally coupled to an environment and is configured to dissipate heat by evaporating a liquid from the sink to the environment. The second plate is arranged to be thermally coupled to the sink.

In one embodiment, a method includes electrically coupling an electronic circuit to at least one thermoelectric cooling module. The at least one thermoelectric cooling module is arranged in at least one zone. Each of the plurality of thermoelectric cooling modules comprises a first plate, a sink, a plurality of thermoelectric elements, and a second plate. The thermoelectric elements are coupled to the first plate and the second plate. The first plate is arranged to be thermally coupled to a first surface. The sink is arranged to be thermally coupled to an environment and is configured to dissipate heat by evaporating a liquid from the sink to the environment. The second plate is arranged to be thermally coupled to the sink.

Depending on the specific features implemented, particular embodiments may exhibit some, none, or all of the following technical advantages. For example, thermoelectric cooling module may be used to provide a temperature control device that may be well suited for the enclosure cooling or heating and personal cooling or heating market due to one or more of: being light weight, compact size, high surface area, high coefficient of performance ("COP"), high volume manufacturing processes (e.g., providing lower costs), low weight, and low volume. As another example, a temperature controller can be embedded within the system, which can monitor the temperature of hot side plate of the thermoelectric cooling module and turn off (or reduce power to) thermoelectric cooling module if it has reached a temperature that is unsafe for person wearing apparel. Other technical advantages will be readily apparent to one skilled in the art from the following figures, description and claims.

BRIEF DESCRIPTION OF THE DRAWINGS

Reference is now made to the following description taken in conjunction with the accompanying drawings, wherein like reference numbers represent like parts.

DETAILED DESCRIPTION

Figure 1:
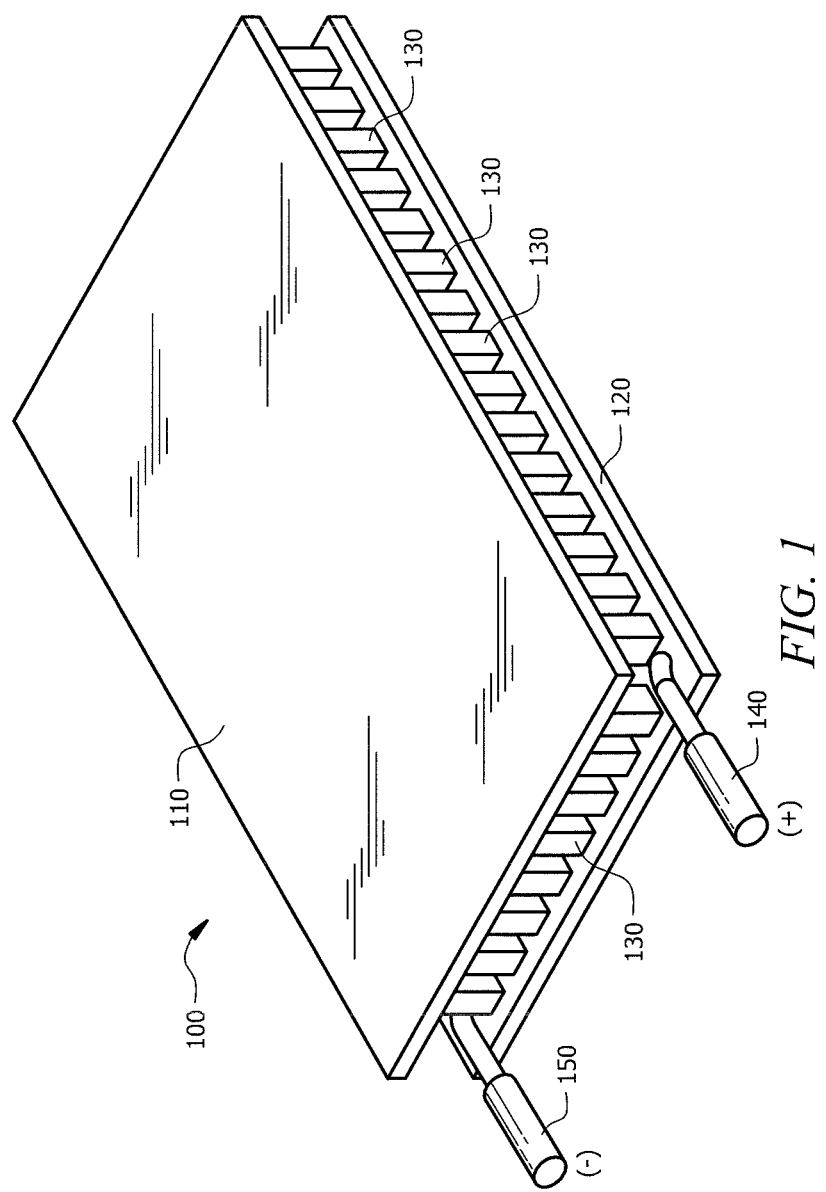
FIG. 1 illustrates one embodiment of a thermoelectric device.

FIG. 1 illustrates one embodiment of thermoelectric device 100. Thermoelectric device 100 includes a plurality of thermoelectric elements 130 disposed between plates 110 and 120. Electrical terminals 140 and 150 are provided to allow thermoelectric device 100 to be electrically coupled to one or more devices that use, transform, or store electrical power.

In some embodiments, thermoelectric elements 130 are fabricated from dissimilar semiconductor materials such as N-type thermoelectric elements and P-type thermoelectric elements. Thermoelectric elements 130 are typically configured in a generally alternating N-type element to P-type element arrangement and typically include an air gap disposed between adjacent N-type and P-type elements. In many thermoelectric devices, thermoelectric materials with dissimilar characteristics are connected electrically in series and thermally in parallel.

Examples of thermoelectric devices and methods of fabrication are shown in U.S. Pat. No. 5,064,476 titled Thermoelectric Cooler and Fabrication Method; U.S. Pat. No. 5,171,372 titled Thermoelectric Cooler and Fabrication Method; and U.S. Pat. No. 5,576,512 titled Thermoelectric Apparatus for Use with Multiple Power Sources and Method of Operation. These patents are incorporated by reference into the present disclosure.

N-type semiconductor materials generally have more electrons than would be found in the associated ideal crystal lattice structure. P-type semiconductor materials generally have fewer electrons than would be found in the associated ideal crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers that transport or move heat energy between plates 110 and 120 through thermoelectric elements 130 when subject to a DC voltage potential. These same agents or carriers may generate electrical power when an appropriate temperature difference is present between plates 110 and 120. Terminals 140 and 150 may be coupled to one of plates 110 and 120 in a manner that withstands high temperature environments, such as resistance welding, tungsten inert gas (TIG) welding, and laser welding.

In some embodiments, thermoelectric elements 130 may include thermoelectric material. Examples of suitable thermoelectric materials include bismuth telluride, which can take the form of thin film, bulk material, or printable bismuth telluride.

In some embodiments, alternating thermoelectric elements 130 of N-type and P-type semiconductor materials may have their ends connected by electrical conductors. Conductors may be metallizations formed on thermoelectric elements 130 and/or on the interior surfaces of plates 110 and 120. Conductors may include aluminum, copper, silver, nickel, titanium, and stainless steel, for example. Ceramic materials may be included in plates 110 and 120 which define in part the cold side and hot side, respectively, of thermoelectric device 100. In some embodiments, the ceramic materials may provide electrical isolation from hot and cold side sources. Examples of suitable ceramic materials include anodized aluminum, aluminum oxide, aluminum nitride, and beryllium oxide.

In some embodiments, thermoelectric elements 130 may be coupled to plates 110 and 120 using a medium. The medium may include adhesive and/or solders. Examples of suitable solders include tin-lead (SnPb), tin-antimony (SnSb), bismuth-tin (BiSn), tin-indium (SnIn), and lead (Pb) and an example of an adhesive is an electrically conductive epoxy.

Figure 2A:
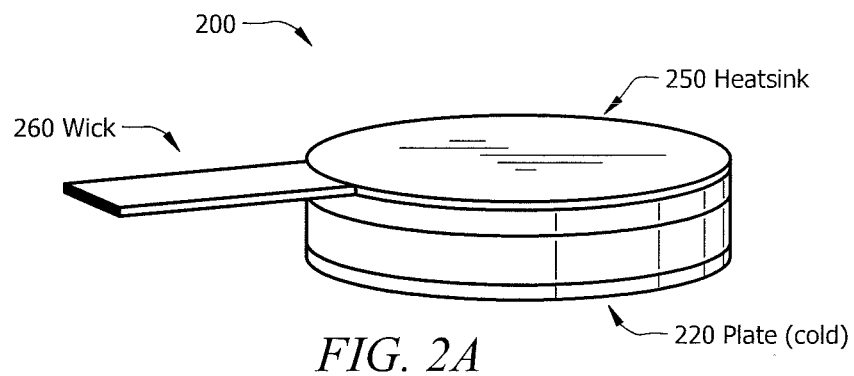
FIGS. 2A and 2B illustrate one example of a thermoelectric cooling module and an exploded view of a thermoelectric cooling module, respectively.
Figure 2B:
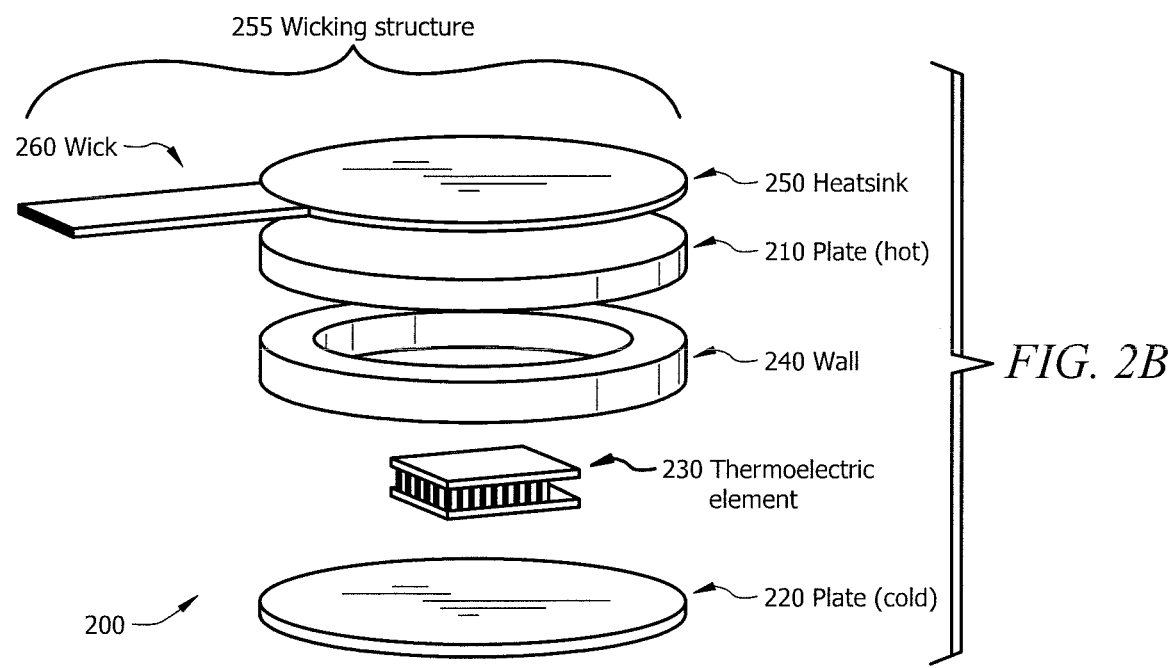

FIG. 2A illustrates one example of thermoelectric cooling module 200. FIG. 2B illustrates an exploded view of thermoelectric cooling module 200. Thermoelectric cooling module 200 includes first plate 210, second plate 220, thermoelectric device 230, wall 240, heatsink 250, and wick 260. First plate 210 may be fastened to second plate 220. Thermoelectric device 230 is situated between plates 210 and 220 such that one side of thermoelectric device 230 is thermally coupled to plate 210 while another side of thermoelectric device 230 is thermally coupled to plate 220. Surrounding thermoelectric device 230 is wall 240. Plate 210 may be thermally coupled to heatsink 250 such that heatsink 250 evaporates a cooling liquid (e.g., water, alcohol, water/alcohol mixtures) in order to further cool plate 220. The heat from plate 210 causes evaporation, which releases the heat from plate 210 to environment 270. In some embodiments, thermoelectric device 230 may be implemented using the examples discussed above with respect to thermoelectric device 100.

In some embodiments, thermoelectric cooling module 200 may be useful in cooling applications, such as cooling an athlete. Power may be supplied to thermoelectric element 230 such that the side thermally coupled to plate 220 becomes cold and the side thermally coupled to plate 210 becomes hot. Heatsink 250, which is thermally coupled to hot plate 210 may receive a cooling liquid via wick 260. This liquid may be evaporated to environment 270, thus transferring large amounts of heat from plate 210. A benefit of this approach is effectiveness in high humidity environments (e.g., environment 270), which may be difficult to provide sufficient cooling using prior cooling systems. Using hot plate 210, which may be at a higher temperature than the body) to drive evaporation, forces more heat into the ambient air (e.g., environment 270) than sweating caused by the human body.

In some embodiments, plates 210 and 220 may be implemented using the examples discussed above with respect to plates 110 and 120 of FIG. 1. Plates 210 and 220 may be implemented using conductive metals, copper, aluminum, graphite, conductive plastics, ceramic, silicon carbon, or other suitable ceramic materials that can be electrically insulated and have good thermal conductance to provide heat transfer with minimal resistance. Plates 210 and 220 may be circular, square, polygonal, or any shape with a surface area able to dissipate heat to environment 270. In some embodiments, plates 210 and 220 are a matching shape as heatsink 250 and wall 240.

In some embodiments, wall 240 provides structural support to thermoelectric cooling module 200. In some embodiments, wall 240 may be a low conductivity wall. For example, thermally insulative materials (e.g. polysulfone, Teflon, polycarbonate, nitrile, acrylic) or structural insulating foam (e.g., polyurethane) may be used to form wall 260. This may reduce, minimize, or prevent thermal shorting from the hot side to the cold side of thermoelectric device 230. Further, wall 240 may insulate thermoelectric device 230 and may reduce the likelihood that liquid from wick 260 interacts with thermoelectric device 230. Also, wall 240 may help contain liquid within heatsink 250 such that it does not leak outside of thermoelectric cooling module 200. This may prevent any liquid from reaching a wearer of thermoelectric cooling module 200 (e.g., athlete wearing athletic shirt incorporating thermoelectric cooling module 200).

In some embodiments, heatsink 250 is thermally coupled to plate 210 to aid in dissipating thermal energy of thermoelectric device 230 to adjacent environment 270. Any heat extracted from the cold side of thermoelectric device 230 may be to be dissipated to ambient on the hot side. In some embodiments, heatsink 250 includes a wicking fabric that is able to hold, and assist in evaporating, liquid. Heatsink 250 may include, for example, a copper disc with a diameter of about 1 inch (e.g., 0.25-2 inch diameter) with the wicking fabric at the top, where the liquid may evaporate into environment 270. In some embodiments, heatsink 250 may be a copper disc that acts as a grommet, which can integrate thermoelectric cooling module 200 into a piece of athletic apparel (e.g., apparel 380 and/or 480). In some embodiments, the wicking fabric assists in transferring liquid to thermoelectric cooling module 200 using capillary action, caused by twists of fibers material that allows the liquid to move through the gaps in the twists of fibers). Wicking fabric may be, for example, polyester, polyester blends, teflon, cotton, wools, or any material sufficient to provide capillary action.

In some embodiments, the hot side plate 210 drives evaporation by heating the wicking fabric and thus causing any liquid held in the wicking fabric to evaporate. For example, 500 ml of evaporating water has the capacity to transfer 330 watts (W) of heat to environment 270 for a period of 1 hour even with a temperature differential between plate 210 and plate 220 of about 0 degrees. In some embodiments, this provides an additional cooling feature to cold side plate 220 without using a fin heatsink or using fan blow air (e.g., dissipate heat). Not including these additional components saves power and reduces bulk in the device. In some embodiments, heatsink 250 allows for heat dissipation when environment 270 contains any amount of humidity. Heatsink 250 may be dissipate heat effectively in a low humidity environment (e.g., 0-50%) as well as a high humidity environment (e.g., 60-100%). Being able to dissipate heat in a high humidity environment is advantageous because traditional cooling systems are less effective in high humidity.

In some embodiments, wick 260 provides cooling liquid to heatsink 250. Wick 260 may retrieve the cooling liquid (e.g., water, alcohol, water/alcohol mixture) from a reservoir and transfer the liquid to heatsink 250. In some embodiments, wick 260 assists in transferring liquid to thermoelectric cooling module 200 using capillary action. Wicking 260 may be, for example, polyester, polyester blends, teflon, cotton, wools, or any material sufficient to provide capillary action. In some embodiments, for example, where a reservoir of water is arranged above any thermoelectric cooling module 200, gravity may also assist wick 260 in transferring the liquid. In some embodiments, wick 260 may be coated or encapsulated (e.g., with a polymer) to prevent, reduce, or minimize liquid loss when transferring. Wick 260 may be flexible material such that the material is comfortable (e.g., not stiff) to user. Coating wick 260 may also keep a wearer of thermoelectric cooling module 200 dry by keeping liquid contained in wick 260 rather than allowing it to spread out (e.g., to athletic apparel that thermoelectric cooling module 200 is incorporated into). In some embodiments, wick 260 and heatsink 250 may be form a single wicking structure 255 (e.g., a uniform piece of fabric), with the portion of the wicking structure 255 attached to the hot side plate 210 open to environment 270 to allow for evaporation and the portion of the wicking structure (e.g., wick 260) transferring liquid coated in a polymer to prevent liquid loss. By forming wick 260 and heatsink 250 out of a single wicking structure 255, fabrication and production costs may be reduced.

In some embodiments, thermoelectric cooling module 200 may be used in a system to cool the body temperature of a person. In some embodiments, user may put cold side plate (e.g., plate 220) against the skin of the user. Cooling liquid is provided to thermoelectric cooling module 200 through wick 260. When electrical power is applied to thermoelectric cooling module 200, heat is pumped by thermoelectric device 230 to plate 210 and the cooling liquid is evaporated due to being thermally coupled to hot side plate (e.g., plate 210). The combination of the evaporation of the cooling liquid and thermoelectric device 230 having a cool side plate (e.g., plate 220) provides a cooling sensation to user. In some embodiments, the user's body temperature may be lowered or reduced. User may wear thermoelectric cooling module 200 during exercise activities and/or while at rest.

In some embodiments, thermoelectric cooling module 200 may be used to provide warmth or heat in addition to cooling. In some embodiments, a user may put hot side plate (e.g., plate 220) against the skin of the user. When electrical power is applied to thermoelectric cooling module 200, heat is pumped by thermoelectric device 230 to plate 220. Coupling plate 220 to user provides a warming sensation to the user. The some embodiments, a user's body temperature may be raised or increased. User may wear thermoelectric cooling module 20, for example, when working in a cold environment, during physical treatment, and/or while at rest. Although this disclosure names certain objects as "cooling devices," "cooling modules," or "cooling systems," (e.g., thermoelectric cooling modules 200, 301-302, 401-402, 700; thermoelectric cooling systems 300, 400, 700), it should be understood that any of these devices, modules, or systems can providing heating or warming in addition to, or in the place, of a cooling feature.

In some embodiments, thermoelectric cooling module 200 may exhibit one or more technical advantages. For example, thermoelectric cooling module 200 may be used to provide a temperature control device that may be well suited for the enclosure cooling and personal cooling market due to one or more of: being light weight, compact size, high surface area, high coefficient of performance ("COP"), high volume manufacturing processes (e.g., providing lower costs), low weight, and low volume.

Figure 3:
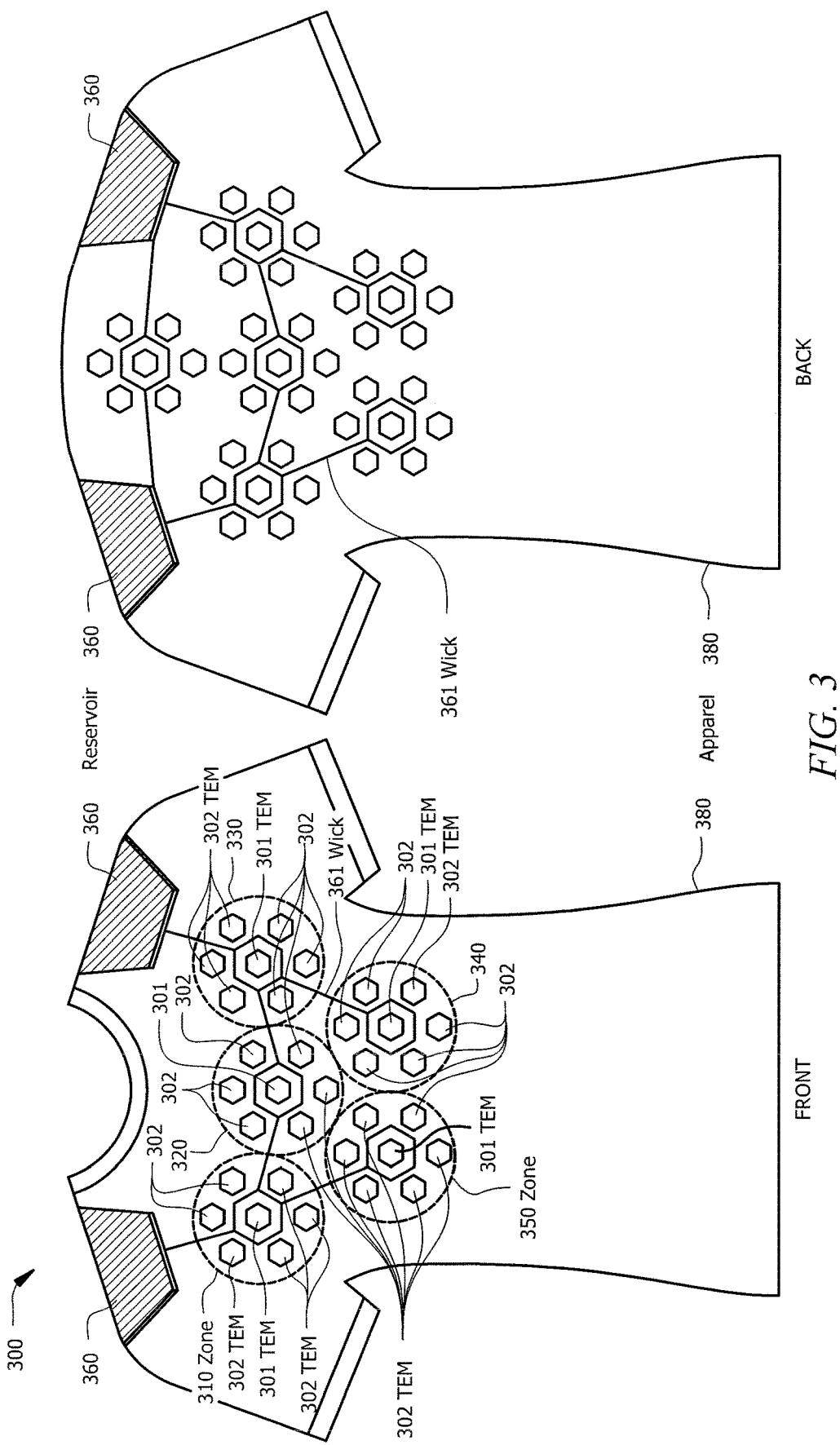
FIG. 3 illustrates one example of a thermoelectric cooling system.

FIG. 3 illustrates one example of a thermoelectric cooling system 300. Thermoelectric cooling system 300 includes one or more reservoirs 360 and thermoelectric cooling modules 301-302 organized into zones 310, 320, 330, 340, and 350 on a piece of apparel 380. Apparel 380 may be athletic apparel, such as a shirt, sweatshirt, hoodie, tank top, wristband, headband, armband, pant, shoe, hat, hardhat, jeans, clothing that can be used during any form of light to intense exercise, clothes used in a warm or cold work environment, or any other piece of apparel. In some embodiments, thermoelectric cooling modules 301-302 may be implemented using the examples discussed above with respect to thermoelectric cooling module 200.

In some embodiments, reservoirs 360 contain liquid (e.g., water, alcohol, water/alcohol mixtures) and can retain the liquid until needed for thermoelectric cooling modules 301-302. As an example, reservoirs 360 may have a capacity of 100-500 ML. Reservoirs 360 may provide cooling through a cooling liquid and/or may provide hydration to the user or wearer of apparel 380. In some embodiments, wicks 361 are coupled to reservoir 360 and thermoelectric cooling modules 301-302 such that wicks 361 may transport cooling liquid from reservoir to thermoelectric cooling modules 301-302. Gravity may aid in transporting the cooling liquid. Reservoirs 360, although shown near a shoulder location of apparel 380 in FIG. 3, may be placed in any suitable location within thermoelectric cooling system 300. In some embodiments, reservoirs 360 may provide hydration to user of apparel 380. For example, reservoirs 360 may include a tube, straw, or opening for user to access the liquid. Providing a hydration function is advantageous because it provides further cooling to the user and may protect the user in high heat environments.

In some embodiments, zones 310-350 may include a plurality of thermoelectric cooling modules 301-302 arranged in a configuration. Zones 310-350 may be located at or near parts of the body with relatively higher heat flux (e.g., chest and back). Zones 310-350 may include any number of thermoelectric cooling modules 301-302 and may be in any suitable shape or configuration (e.g., circular, orthogonal, random). In some embodiments, each of zones 310-350 may have a primary thermoelectric cooling module 301. In some embodiments, primary thermoelectric cooling module 301 may be the first thermoelectric cooling module 301 of zone 310 to receive cooling liquid from reservoir 360. For example, thermoelectric cooling module 301 may have a wick (e.g., wick 260) leading to it from reservoir 360, and may have multiple wicks 360 spanning from it such that cooling liquid is dispersed thermoelectric cooling modules 302 in zone 310.

In some embodiments, thermoelectric cooling system 300 provides cooling to a person wearing apparel 480. Liquid may be transferred from reservoir 360 to thermoelectric cooling module 301 via wick 361. In some embodiments, thermoelectric cooling module 301 acts as a primary thermoelectric cooling module 301 such that it receives liquid first and distributes liquid to thermoelectric cooling modules 302 within its zone and/or to thermoelectric cooling modules 301 in other zones. For example, thermoelectric cooling module 301 in zone 310 may receive liquid from reservoir 360 and using wick 361 may transfer liquid to thermoelectric cooling modules 302 in zone 310 as well as thermoelectric cooling module 301 of zone 350. Once thermoelectric cooling modules 301-302 receive the liquid, it may operate as described above in FIG. 2 in order to provide cooling to a person wearing apparel 380.

In some embodiments, thermoelectric cooling system 300 includes a thermally conductive layer, which may extend the cooling surface beyond the surface of thermoelectric cooling modules 301-302. One or more thermoelectric cooling modules 301-302 may be mounted to the thermally conductive layer (e.g., carbon fiber fabric). In some embodiments, thermoelectric cooling modules 301-302 may be connected to the fabric using a grommet or the copper disc of heatsink may provide a connection to the fabric. The cooling provided by cool plate (e.g., the plate contact the skin of user; plate 220 of FIG. 2) may extend to the fabric. Thus a user would feel a cooling sensation anywhere that the fabric touches the user's skin. This may be advantageous because it increases the cooling surface provided to the user, such that the user feels one large cooling surface from the fabric, rather than multiple individual cooling surfaces from each individual thermoelectric cooling module 301-302.

In some embodiments, thermoelectric cooling system 300 may exhibit one or more technical advantages. For example, including reservoir 360 with a large enough volume (e.g., 100-500 mL) may provide enough liquid such that thermoelectric cooling modules 301-302 provide cooling for two to three hours. As another example, placing reservoir 360 near the top of apparel 360 (e.g., near the shoulder, above thermoelectric cooling modules 301-302), allows gravity to aid in transferring liquid from reservoirs 360 to thermoelectric cooling modules 301-302. Using gravity reduces the need for additional equipment that aids in transferring liquid, thus reducing production and fabrication costs.

Figure 4:
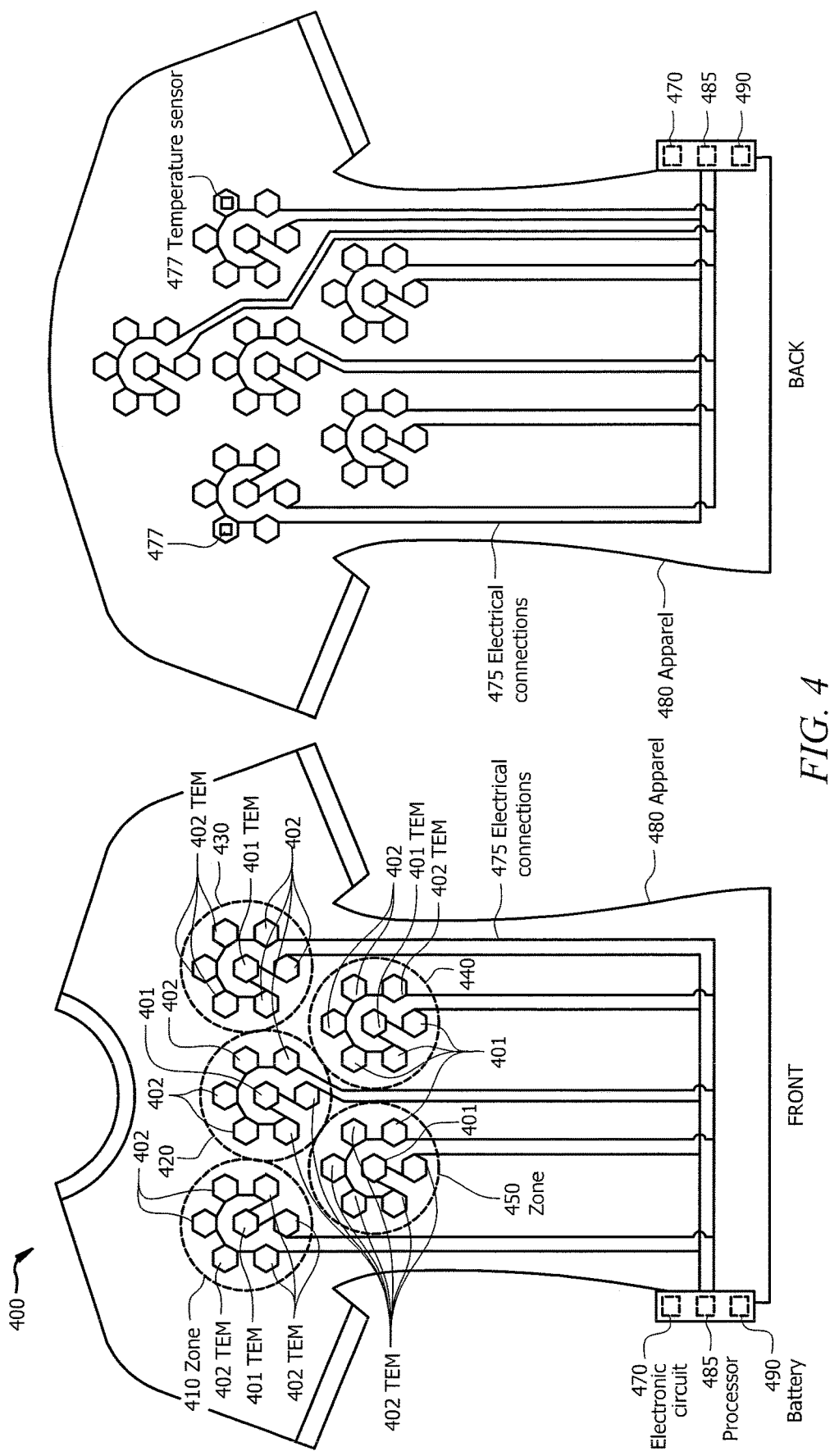
FIG. 4 illustrates an example of electric wiring for thermoelectric cooling system.

FIG. 4 illustrates an example of electric wiring for thermoelectric cooling system 400. Thermoelectric cooling system 400 includes one or more electronic circuits 470, processors 485, power sources 490, electrical connections 475, temperature sensors 477, and plurality of thermoelectric cooling modules 401-402 organized into zones 410, 420, 430, 440, and 450 on a piece of apparel 480. In some embodiments, thermoelectric cooling modules 401-402, zones 410-450, and apparel 480 may be implemented using the examples discussed above with respect to thermoelectric cooling modules 200, 301, and 302, zones 310-350, and apparel 380, respectively.

In some embodiments, power source 490 may be a DC battery, rechargeable lithium-ion batteries, supercapacitor, wall charger, or any other source capable of providing power to thermoelectric cooling modules 401-402. Power source 490 may provide electricity to thermoelectric cooling modules 401-402. As discussed above regarding FIG. 2, thermoelectric cooling modules 301 and 302 can use this power to cause one side of the module to become cool. In some embodiments, power source 490 uses electrical connections 475 to couple thermoelectric cooling modules 401-402 to power source 490. Electrical connections 475 may include connecting wires as illustrated in FIG. 4; however, other suitable methods of electrically connecting thermoelectric cooling modules 401-402 to electrical power may be used, such as electronic circuit 470. For example, electrical connections 475 may include serpentine shaped wires connecting individual nodes. This is advantageous becomes it promotes garment flexibility and comfort for the user. By wiring thermoelectric cooling modules 401-402 in a combination of series and parallel strings using electrical connections 475, the voltage required to power them remains low less than 12 volts). In some embodiments, each zone 410-450 is electrically isolated such that other zones can continue to receive power if one zone is damaged. In some embodiments, each zone 410-450 is electrically isolated such that each zone 410-450 can be programmed differently (e.g., receive a different amount of power, be set at a different temperature, have different thresholds) from another zone.

In some embodiments, temperature sensors 477 may determine the temperature of one or both sides of thermoelectric cooling modules 401-402. Considering the arrangement from FIG. 2: temperature sensor 477 may monitor the temperature of plate 210 (e.g., hot plate), plate 220 (e.g., cold plate), or both. In some embodiments, monitoring the temperatures of plates 210 and 220 may allow thermoelectric cooling system to turn off thermoelectric cooling modules 401-402 once the cold side plate (e.g., plate 220) has reached a set point temperature (e.g., 10° Celsius to 30° Celsius) and/or once the hot side plate (e.g., plate 220) has reached a temperature safety threshold (e.g., 40° Celsius to 50° Celsius), as explained further below in FIG. 5. Temperature sensors 477 may be integrated in electronic circuit 470 and electrical connections 475. For example, temperature sensors 477 may be thermistors. Although FIG. 4 illustrates two temperature sensors 477, it should be understood that thermoelectric cooling system 400 may include any number of temperature sensors. For example, each thermoelectric cooling module 200 may include one or more temperature sensors 477.

In some embodiments, when thermoelectric cooling module 401-402 is attached to power source 490 (e.g., a DC battery), one side of the module will be cold and another side will be hot. The polarity of the current from power source 490 determines which side of thermoelectric cooling module 401-402 is hot and which is cold. For example, consider a scenario in which thermoelectric cooling modules 401-402 are implemented using the examples discussed above regarding FIG. 2: plate 220 may be thermally coupled to an athlete and be cold, while plate 210 may be thermally coupled to environment 270 (e.g., the environment outside of the athlete's body) and be hot. Heatsink 250 may aid in transferring thermal energy out of thermoelectric device 230 by evaporating cooling liquid from plate 210 to environment 270.

In some embodiments, the polarity of the current from power source 490 can be switched such that plate 220 may be thermally coupled to a person and be hot, while plate 210 may be thermally coupled to environment 270 and be cold. This provides thermoelectric cooling modules 401-402 to provide warmth, for example, when user is in a cold working environment. In some embodiments, zones 410-450 may be wired in parallel or each have its own power source 490. This may allow each zone 410-450 to be controlled independently of the other zones. This independent control of each zone 410-450 may be beneficial when an athlete wants one zone (e.g., zone 420 in the middle of the athlete's back) to provide a lower temperature than other zones 410, 430, 440, and 450. In some embodiments, individual control of the polarity of each zone allows for some zones to provide heating (e.g., temperature above body temperature) and others to provide cooling (e.g., temperature below body temperature). For example, zones 410-430 may provide cooling and zones 440-450 may provide heating. Providing different zones at different temperatures may be beneficial, for example, for a person undergoing some kind of therapy treatment.

In some embodiments, electronic circuit 470 may be used to configure thermoelectric cooling modules 401-402. Electronic circuit 470 may be used to provide one or more aspects of control to thermoelectric cooling modules 401-402 and zones 410-450. Electronic circuit 470 may include integrated components such as controllers and processors (e.g., processor 485) to provide functionality such as temperature control. For example, electronic circuit 470 may be used as a temperature controller that turns thermoelectric cooling modules 401-402 on and off based on one or more temperature thresholds (e.g., using temperature sensors 477). Processor 485 may comprise any suitable combination of hardware and software implemented in one or more modules to execute instructions and manipulate data to perform the described functions for thermoelectric cooling system 400. In some embodiments, processors 485 may include, for example, one or more computers, one or more central processing units (CPUs), one or more microprocessors, one or more applications, and/or other logic.

One or more advantages may be present in some embodiments when electronic circuit 470 is used. One such advantage is that a temperature controller can be embedded within system 400, which can monitor the temperature of hot side plate (e.g., using temperature sensor 477) of thermoelectric cooling module 401-402 and determine whether it has reached a temperature (e.g., above 40° Celsius to 50° Celsius) that is unsafe for person wearing apparel 480.

Figure 5:
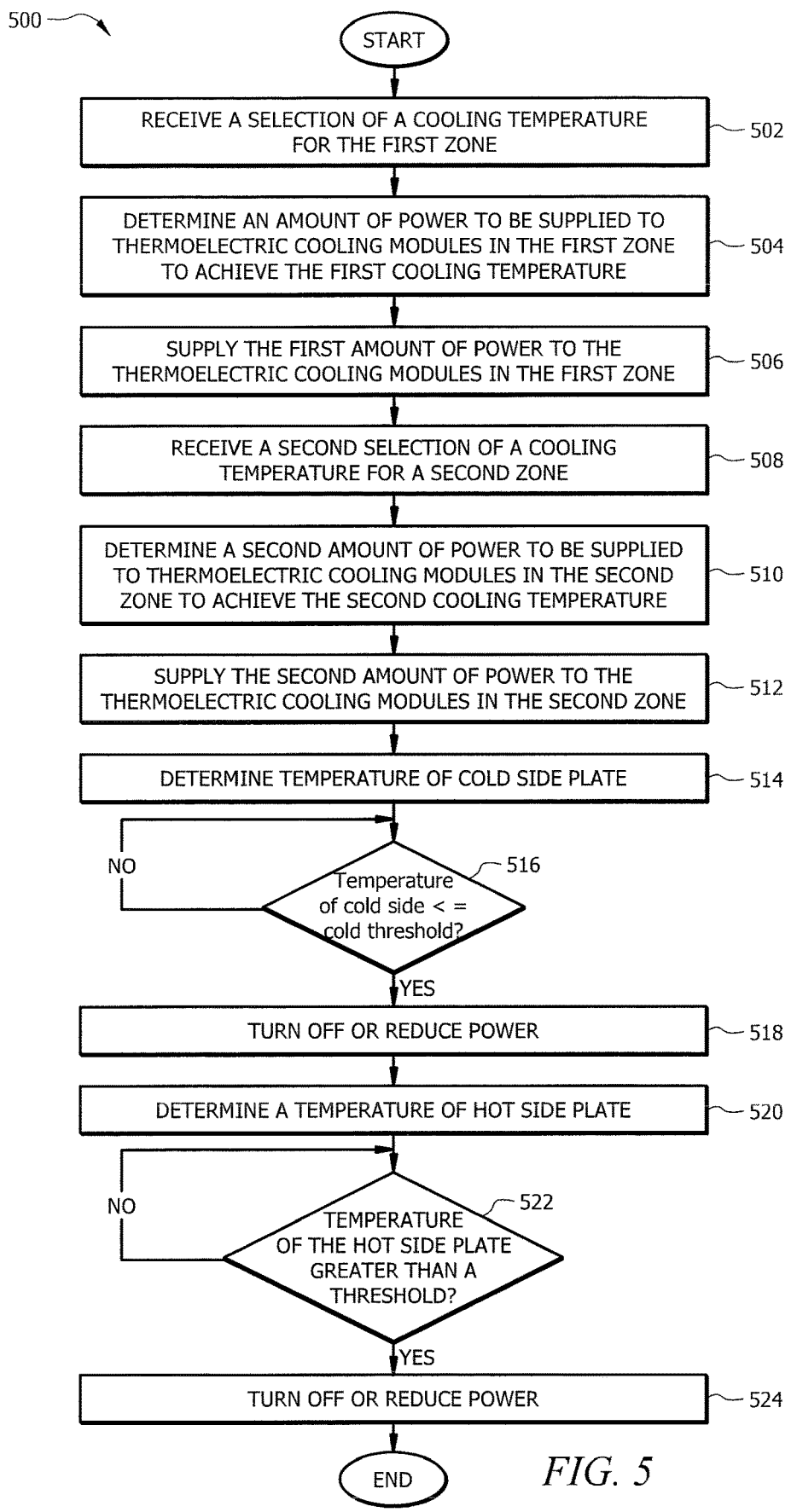
FIG. 5 illustrates an example method for controlling the temperature of thermoelectric cooling modules.

FIG. 5 illustrates an example of a method 500 for controlling the temperature of thermoelectric cooling modules. In describing method 500, reference to embodiments disclosed in FIGS. 1-4 may be made to provide further examples and explanations. In some embodiments, processor 485 of FIG. 4 may perform these steps, but it should be understood that any component of FIG. 4 may be used to perform these steps.

At step 502, in some embodiments, processor 485 receives a selection of a cooling temperature for the first zone. The cooling temperature may be preset by a manufacturer or may be inputted by a user. User may input the desired cooling temperature, for example, using an interface coupled to the thermoelectric cooling system, connecting thermoelectric cooling system to a personal computer, or using a user device (e.g., cell phone or tablet) to connect wirelessly (e.g., bluetooth, wifi), or in a wired manner. Although described as a cooling temperature, it should be understood that in some embodiments, it may be a heating temperature (e.g., when the battery reverses the polarity of the current such that the plate thermally coupled to the person is hot while the plate thermally coupled to the environment is cold, described above). For example, if a user selects a temperature that is warmer than body temperature, that may be a heating temperature.

At step 504, in some embodiments, processor 485 determines an amount of power to be supplied to thermoelectric cooling modules (e.g., 301-302 and/or 401-402) in the first zone to achieve the first cooling temperature. For example, processor 485 may use the following formula to determine the necessary power (P), using coefficient of performance (COP) and thermal cooling load ($Q_c$):

$$COP = Q_c/P$$

COP is a function of temperature differential between the hot side (e.g., plate 210 of FIG. 2) and the cold side (e.g., plate 220 of FIG. 2) in a thermoelectric cooling module (e.g., 200 of FIG. 2). Generally, the highest COP possible is desired to reduce power consumption. COP values generally increase with decreasing temperature differential. Having a low temperature differential allows COP to be increased. This allows for the electrical power requirements to stay at manageable battery volumes, thus reducing the bulk, space, and material requirements. In finding the amount of power to use, processor 485 may have a set COP value to use that balances the considerations of making the cold side cool enough to sufficiently cool the user without making the hot side too hot to be dangerous. For example, with a COP of 1.5, ambient temperature of 26° (C.), and about 50% relative humidity, processor 485 can use 60 W of power to create a cold side temperature of 18.4° (C.) and a hot side of 39.5° (C.). As another example, with a COP of 2.4, ambient temperature of 26° (C.), and about 50% relative humidity, the system can use 36 W of power to create a cold side temperature of 20.4° (C.) and a hot side temperature of 34.45° (C.). Operating at a COP of 2.4 for one hour would require a battery capacity of about 36 watt-hours, which for current rechargeable lithium-ion batteries would equate to an equivalent volume of 7 D-cell batteries. In some embodiments, this step may be omitted. For example, processor 485 may supply a standard or pre-set amount of power to thermoelectric cooling modules (e.g., 301-302 and/or 401-402) and continue to supply power until a cold threshold is reached. This is explained further in steps 514-518 below.

At step 506, in some embodiments, processor 485 supplies the first amount of power to the thermoelectric cooling modules in the first zone. Power may be supplied from power source 490, electronic circuit 470, or any other means. Power may be transmitted using electrical connections 475. In some embodiments, power may be continuously supplied for a predetermined amount of time or may be supplied until thermoelectric cooling system is turned off by user (e.g., after reaching set point temperature, described in step 516 below).

At step 508, in some embodiments, processor 485 receives a second selection of a cooling temperature for a second zone. For example, a user may determine that zones 310, 320, and 330 require more cooling than zones 340 and 350, and thus user may select a lower temperature for zones 310-330 than for zones 340-350. As another example, a user may want certain zones to be warming rather than cooling, and set zones 310-330 for a temperature warmer than for zones 340-350. In some embodiments, one or more aspects of step 508 may be implemented using one or more techniques discussed above with respect to step 502.

At step 510, in some embodiments, processor 485 determines a second amount of power to be supplied to the thermoelectric cooling modules in the second zone to achieve the second cooling temperature and at step 512 supplies the second amount of power to the thermoelectric cooling modules in the second zone. In some embodiments, one or more aspects of steps 510 and 512 may be implemented using one or more techniques discussed above with respect to step 504 and 506, respectively. In some embodiments, this step may be omitted. For example, processor 485 may supply a standard or pre-set amount of power to thermoelectric cooling modules (e.g., 301-302 and/or 401-402) and continue to supply power until a cold threshold is reached. This is explained further in steps 514-518 below.

At step 514, in some embodiments, processor 485 determines a temperature of cold side plate (e.g., plate 220 of FIG. 2) in one or more thermoelectric cooling modules, such as thermoelectric cooling modules 301-302 and/or 401-402. Processor 485 may use electrical connections in order to receive the measurement from temperature sensor 477.

At step 516, in some embodiments, processor 485 determines whether the temperature of the cold side plate determined in step 514 is less than or equal to a cold threshold. Cold threshold may be a set-point temperature selected by user, for example, in steps 502 or 508. Cold threshold may also be a safety threshold that when exceeded may cause discomfort or injury to the user (e.g., 0-10° Celsius). If, at step 516, processor 485 determines that the temperature of the cold side plate is not less than or equal to the cold threshold, then processor 485 continues to monitor the temperature at step 514. If, at step 516, processor 485 determines that the temperature of the cold side plate is less than or equal to the cold threshold, the processor continues to step 518.

At step 518, in some embodiments, processor 485 turns off or reduces power to thermoelectric cooling module. Processor 485 may turn off (or reduce) power to the thermoelectric cooling module associated with the measured plate, to all of the thermoelectric cooling modules in the same zone as the measured plate, and/or may turn off (or reduce) power to all thermoelectric cooling modules in thermoelectric cooling system 300 or 400. Controlling temperatures of cold side plate (e.g., plate 220 of FIG. 2) provides an advantage of protecting user from any danger of the plates being too cold and conserving power. For example, once a cold threshold is reached, power may not be necessary to keep the cold plate at this temperature. Thus, thermoelectric cooling system 300 may turn off or reduce power to thermoelectric cooling module, thus saving resources. In some embodiments, thermoelectric cooling system may continue to monitor the temperature of cold side plate (e.g., in step 514) so that if it warms up (e.g., is not less than or equal to the cold threshold), then the power may be turned up and/or resupplied. In some embodiments, at step 518, processor may turn on a pulse cycle such that power is supplied in cycles to thermoelectric cooling module. This may allow thermoelectric cooling module to remain at the cold threshold and may reduce the amount of power required to maintain the cold side plate temperature.

At step 520, in some embodiments, processor 485 determines a temperature of hot side plate (e.g., plate 210 of FIG. 2) in one or more thermoelectric cooling modules, such as thermoelectric cooling modules 301-302 and/or 401-402. Processor 485 may use electrical connections 475 in order to receive the measurement from temperature sensor 477.

At step 522, in some embodiments, processor 485 determines whether the temperature (e.g., determined at step 520) of the hot side plate (e.g., plate 210 of FIG. 2) is greater than a threshold. The threshold may be preset by a manufacturer, input by a user, or determined based on other conditions (e.g., temperature and/or humidity of environment 270 of FIG. 2). User may input the desired cooling temperature, for example, using an interface coupled to the thermoelectric cooling system, connecting thermoelectric cooling system to a personal computer, or using a user device (e.g., cell phone or tablet) to connect via bluetooth. If, at step 522, processor 485 determines that the temperature of hot side plate (e.g., plate 210 of FIG. 2) is not above a threshold, it does not turn off any thermoelectric cooling modules 301-302 or 401-402 and may continue to monitor the temperature of any plates (e.g., 210). In response to determining that the temperature of the first plate is greater than a threshold at step 522, then at step 524, in some embodiments, processor 485 may turn off or reduce the power. Processor 485 may turn off (or reduce) power to the thermoelectric cooling module associated with the measured plate, to all of the thermoelectric cooling modules in the same zone as the measured plate, and/or may turn off (or reduce) power to all thermoelectric cooling modules in thermoelectric cooling system 300 or 400. Controlling temperatures of hot side plate (e.g., plate 210 of FIG. 2) provides an advantage of protecting user from any danger of the plates being too hot and may protect user from thermal run away as well. Monitoring and potentially turning off (or reducing power to) thermoelectric cooling modules (e.g., 301-302 of FIG. 3 and/or 401-402 of FIG. 4) enhances the safety to any user of thermoelectric cooling system 300 or 400. After this, method 500 ends.

Modifications, additions, or omissions may be made to the methods described herein without departing from the scope of the invention. For example, the steps may be combined, modified, or deleted where appropriate, and additional steps may be added. For example, steps 504 and 510 may be omitted and rather than determine the amount of power to be supplied, processor 485 may apply a pre-set amount of power and monitor the temperature of cold side plate (e.g., at step 514) to determine when power should be reduced or turned off. Additionally, the steps may be performed in any suitable order, including at substantially the same time (e.g., within a second) without departing from the scope of the present disclosure.

Figure 6A:
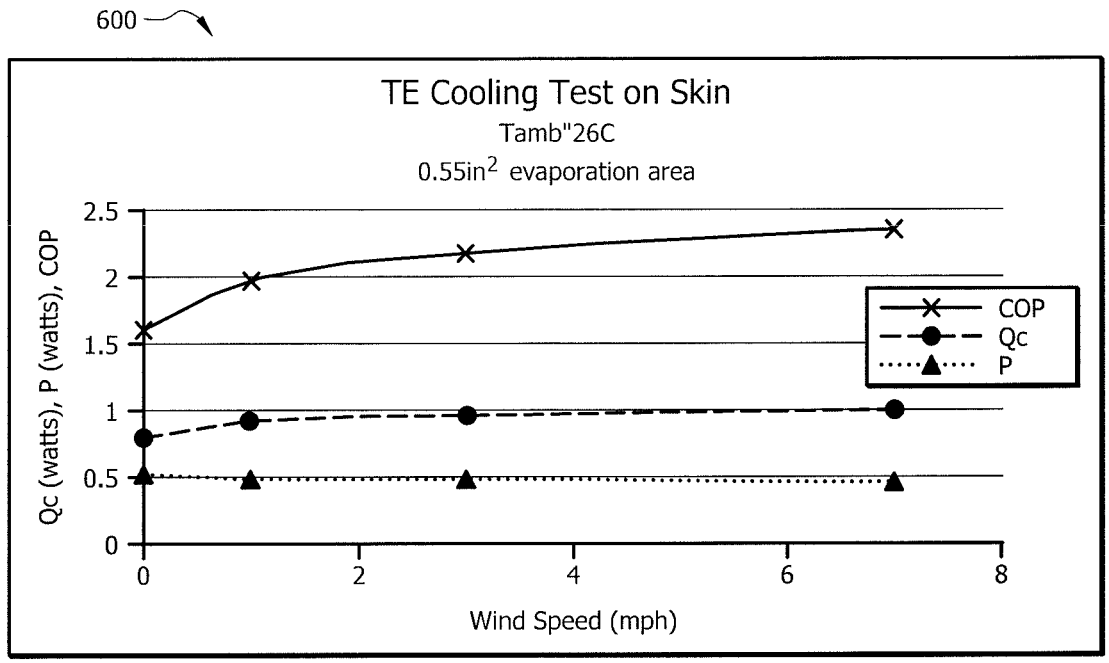
FIGS. 6A, 6B, and 6C are a set of charts depicting examples of performance characteristics of embodiments of thermoelectric cooling modules.
Figure 6B:
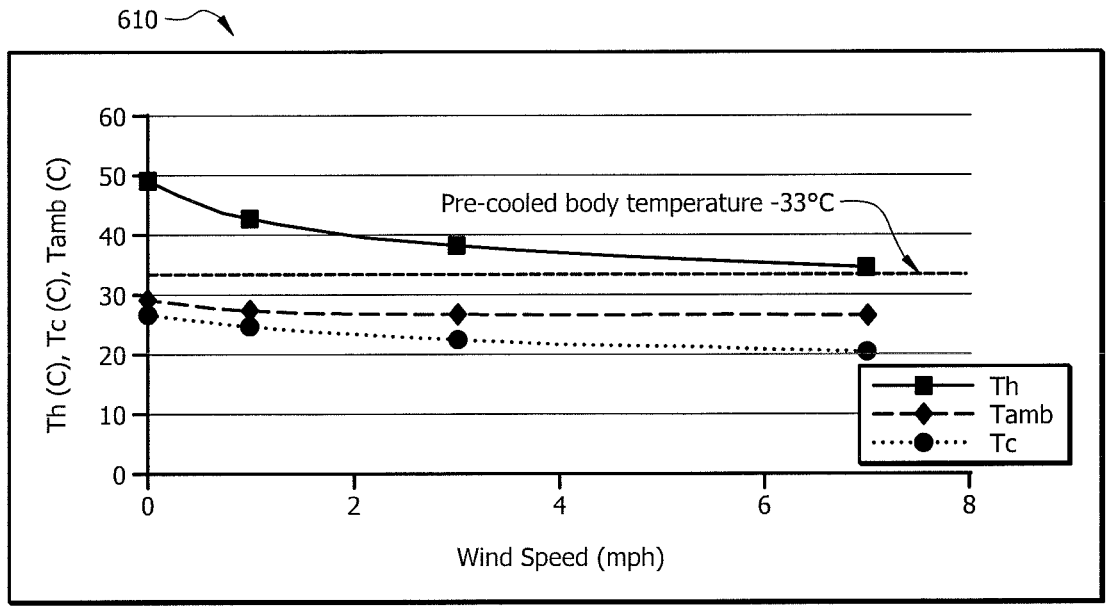
Figure 6C:
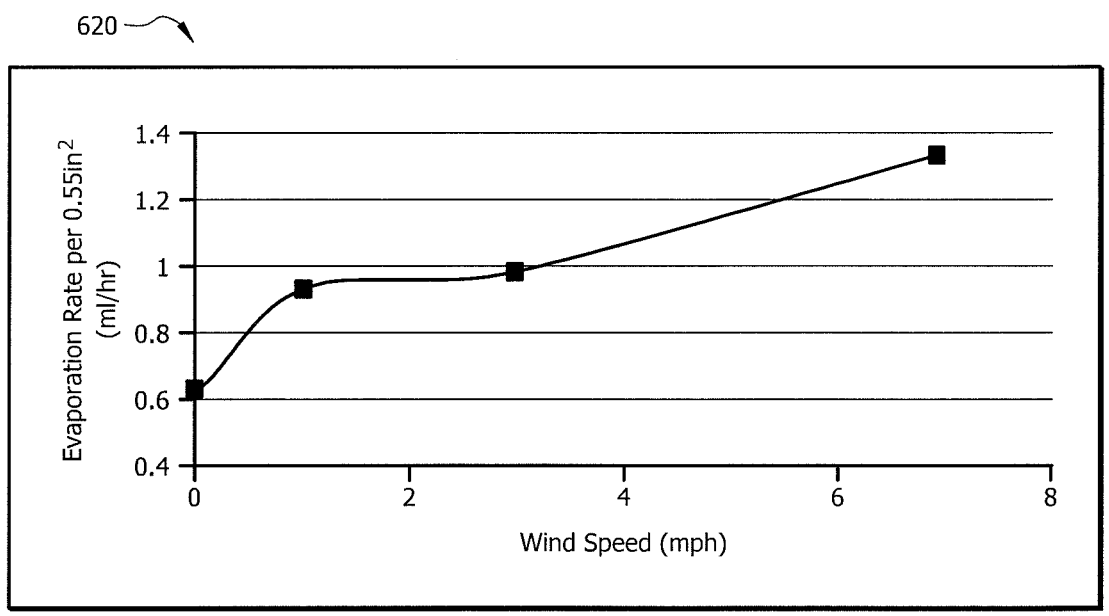

FIGS. 6A, 6B, and 6C are a set of charts depicting examples of performance characteristics (based on models and experiments) of embodiments of thermoelectric cooling modules configured as described above with respect to FIGS. 1-5. Chart 600 depicts power, coefficient of performance (COP), and total amount of heat pumped by the thermoelectric device ($Q_c$) as a function of wind speed. Chart 610 indicate the module hot side temperate (Th), module cold side temperature (Tc), and ambient temperature (Ta) (e.g., temperature of environment 270 of FIG. 2) as a function of wind speed. Chart 620 shows evaporation rate as a function of wind speed. Charts 600-620 show that increasing wind speed aids evaporation and improves performance. Thus, when a person wearing apparel 380 or 480 is moving at fast speeds (e.g., running, biking), or when the person is outside on a windy day, the thermoelectric cooling modules (e.g., 301-302, 401-402) may require less power in order to provide the same cooling effect to the person.

In some embodiments, thermoelectric cooling systems 300 and/or 400 may include one or more fans to further assist in evaporation (e.g., by increasing the wind speed). These fans may be arranged near battery 490, near one or more zones 410-450, near reservoirs 360, or in any position on apparel 480 such that air from the fans will blow across heatsink 250. In some embodiments, thermoelectric cooling systems 300 and/or 400 may include one or more ports to channel air to different nodes such that all nodes receive air flowing across the top, which may help evaporation. For example, while running, air may easily flow across thermoelectric cooling modules (e.g., 301-302 and/or 401-402) at the front of apparel 380 or 480. Continuing the example, ports may channel the air from the front of apparel 380 or 480 to the back of apparel 380 and 480 such that the thermoelectric cooling modules thermally coupled to the back of a user also receive the benefit of air aiding in evaporation and improving the performance.

Figure 7A:
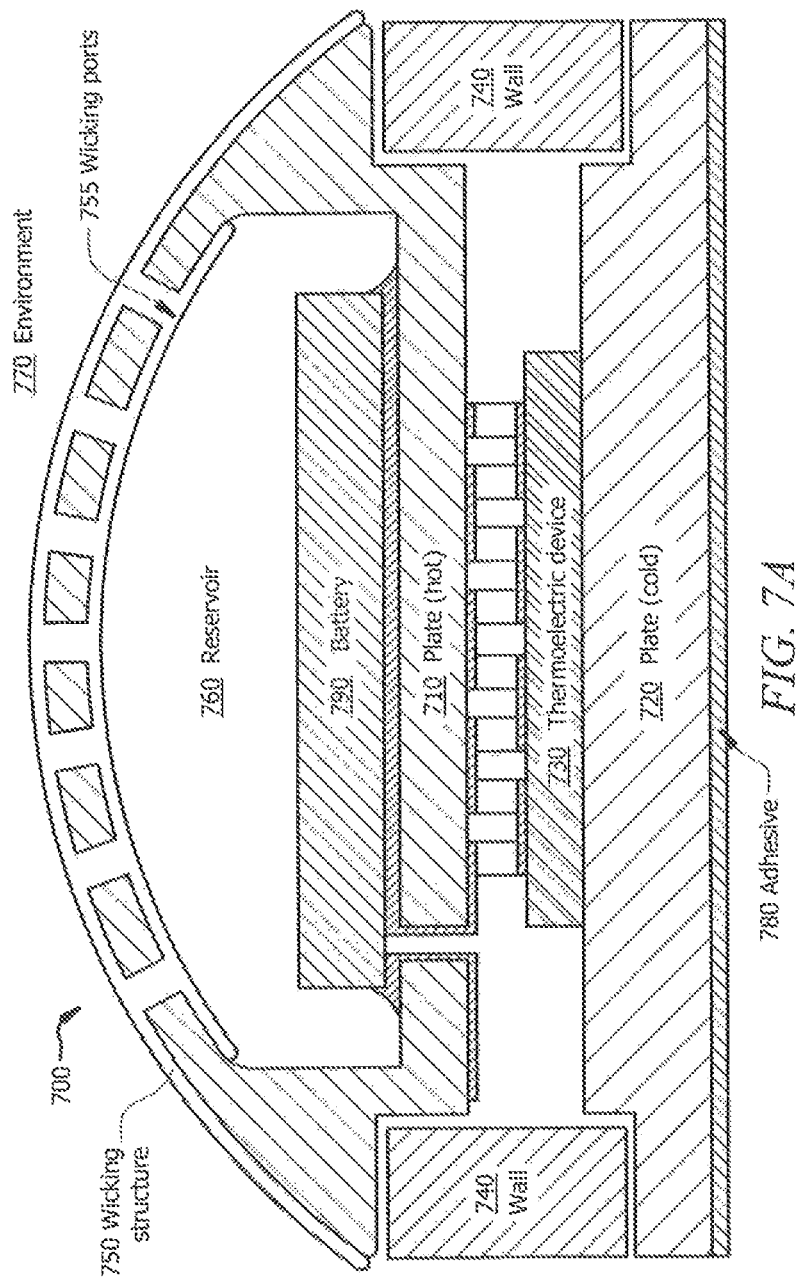
FIGS. 7A and 7B illustrate a cutaway view of one example of thermoelectric cooling module and one example of thermoelectric cooling module, respectively.
Figure 7B:
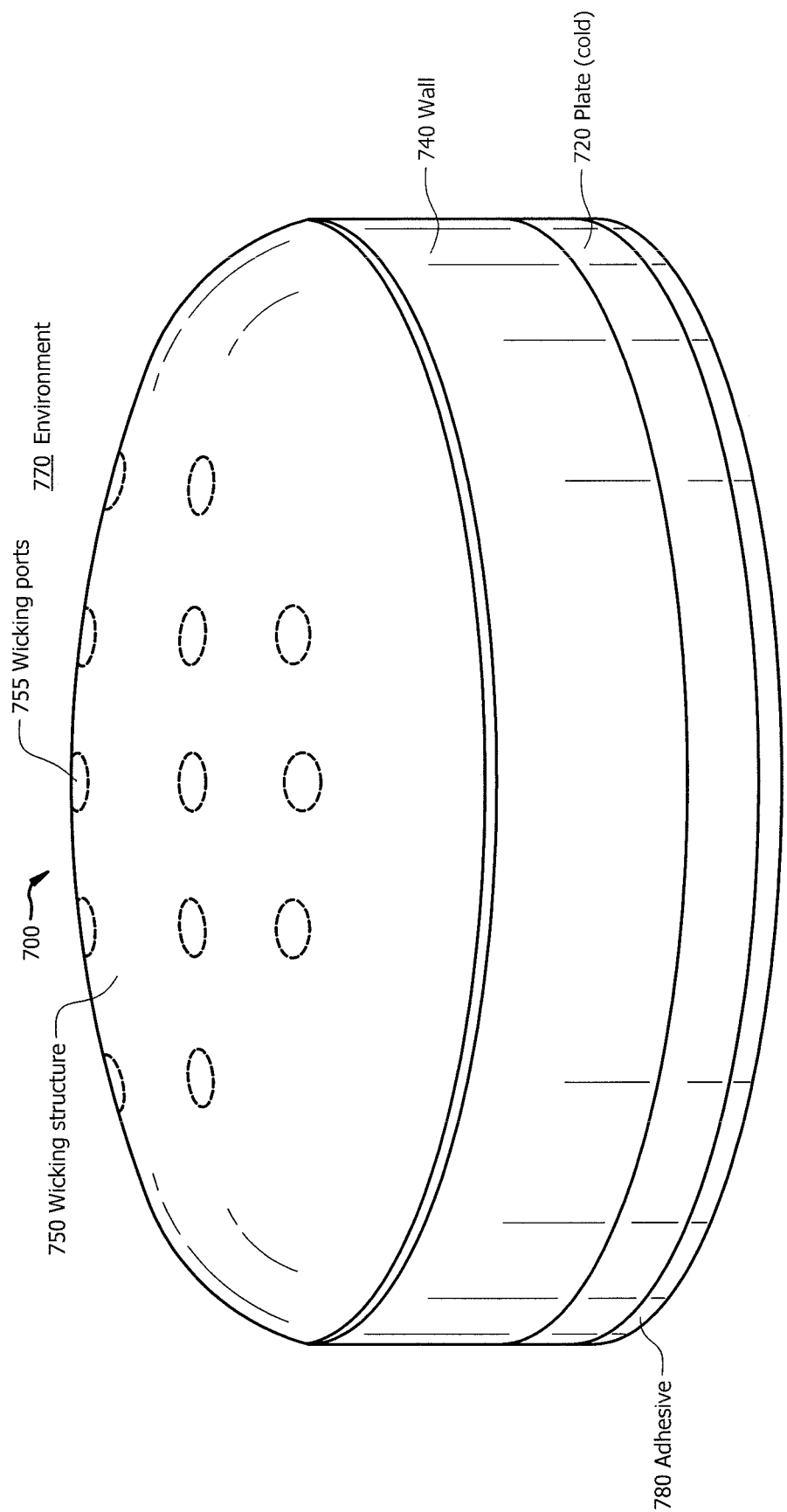

FIG. 7A illustrates a cutaway view of one example of thermoelectric cooling module 700. FIG. 7B illustrates one example of thermoelectric cooling module 700. Thermoelectric cooling module 700 includes plate 710 (e.g., hot plate), plate 720 (e.g., cold plate), thermoelectric device 730, wall 740, wicking structure 750, wicking ports 755, reservoir 760, adhesive 780, and battery 790. Plate 710 may be fastened to second plate 720. Plates 710 and 720 may be, in some embodiments, anodized aluminum, which may protect plates from corrosion. Thermoelectric device 730 is situated between plates 710 and 720 such that one side of thermoelectric device 730 is thermally coupled to plate 710 while another side of thermoelectric device 730 is thermally coupled to plate 720. Surrounding thermoelectric device 730 is wall 740. In some embodiments, plate 710, plate 720, thermoelectric device 730, wall 740, reservoir 760, and battery 790 may be implemented using the examples discussed above with respect to plate 210, plate 220, thermoelectric device 230, and wall 240 of FIG. 2, reservoir 360 of FIG. 3, and battery 490 of FIG. 4, respectively.

In some embodiments, battery 790 may provide power to thermoelectric device 230 such that plate 710 becomes hot and plate 720 becomes cold. In some embodiments, the polarity of the current from battery 790 may be reversed such that plate 710 becomes cold and plate 720 becomes hot. Being able to change the polarity is advantageous because it allows thermoelectric cooling module 700 to provide either cooling or warming to a user without having separate devices. Battery 790 may be, for example, a lithium ion coin cell. Battery 790 may be enclosed within thermoelectric cooling module 700 and accessible by removing wicking structure 750.

In some embodiments, adhesive 780 may be coupled to plate 720. In some embodiments, adhesive 780 may be coupled to a separate object, for example, a body part of a user (e.g., wrist, hand, back, leg, foot, or any other body part that may benefit from heating and/or cooling), item of clothing (e.g., athletic apparel, sweatshirt, hoodie, tank top, wristband, headband, armband, pant, shoe, hat, hardhat, jeans, clothing that can be used during any form of light to intense exercise, clothes used in a warm or cold work environment, or any other piece of apparel), or any object requiring heating or cooling (e.g., plate, mug, food item, refrigerator). Being able to couple an individual thermoelectric cooling module 700 to a separate object is advantageous because it allows a user to create a configuration most suited for the user. For example, a user may want to create a piece of athletic apparel with zones arranged to cool the parts of the user's body that are the hottest (e.g., back, chest, stomach, legs, head, or any other body part). As another example, individual thermoelectric cooling modules 700 may be placed on the body of a person requiring therapy treatment so that heating or cooling may be applied to the specific area.

In some embodiments, wicking structure 750 may be thermally coupled to reservoir and plate 710 such that liquid can evaporate through wicking structure 750. In some embodiments, wicking structure 750 may be detached (e.g., removable) from thermoelectric cooling module 700 such that reservoir 760 may be refilled with liquid without having to go through wicking structure 750. In some embodiments, reservoir may have a capacity of about 2 milliliters (e.g., 1 milliliter-5 milliliters). In some embodiments, wicking structure 750 includes wicking ports 755. Wicking ports 755 provide further openings for liquid from reservoir 760 to be evaporated to environment 770 outside thermoelectric cooling module 700.

In some embodiments, plate 710 may be thermally coupled to reservoir 760 such that liquid from reservoir 760 is evaporated through wicking structure 750 and wicking ports 755 in order to further cool plate 720. The heat from plate 710 causes evaporation, which releases the heat from plate 710 to environment 770. One or more advantages may be present in some embodiments when thermoelectric cooling module 700 is used. One such advantage is that all of the parts are included in one discrete and compact thermoelectric cooling module 700. For example, including battery 790 in thermoelectric cooling module 700 reduces the need for electrical connections (e.g., electrical connections 475 of FIG. 4), which may reduce the bulk and material cost of module 700. As another example, including reservoir 760 in thermoelectric cooling module 700 reduces the material needed to transfer liquid such that it is thermally coupled to hot plate 710 (e.g., reduces the need for wick 260 of FIG. 2). Further, providing a compact module 700 allows for flexibility in placement and configuration of thermoelectric cooling modules 700. For example, zones of thermoelectric cooling modules 700 may be configurable, such that a user may change the positioning, order, number, and pattern of the zones without having to re-wire electrical connections or change the position of a reservoir.

Depending on the specific features implemented, particular embodiments may exhibit some, none, or all of the following technical advantages. For example, thermoelectric cooling modules 200, 301-302, 401-402, and 700 may be used to provide a temperature control device that may be well suited for the enclosure cooling or heating and personal cooling or heating market due to one or more of: being light weight, compact size, high surface area, high coefficient of performance ("COP"), high volume manufacturing processes (e.g., providing lower costs), low weight, and low volume. Other technical advantages will be readily apparent to one skilled in the art from the preceding figures and description as well as the proceeding claims. Particular embodiments may provide or include all the advantages disclosed, particular embodiments may provide or include only some of the advantages disclosed, and particular embodiments may provide none of the advantages disclosed.

Although several embodiments have been illustrated and described in detail, it will be recognized that modifications and substitutions are possible.

What is claimed is:

1. A system, comprising:
   at least one thermoelectric cooling module arranged in at least one zone, each thermoelectric cooling module comprising:
   a first plate, the first plate arranged to be thermally coupled to a first surface;
   a sink, the sink arranged to be thermally coupled to an environment to provide an open system, the sink evaporating a liquid from the sink to the environment;
   a second plate, the second plate arranged to be thermally coupled to the sink; and
   a plurality of thermoelectric elements, the plurality of thermoelectric elements coupled to the first plate and the second plate; and
   an electronic circuit, the electronic circuit electrically coupled to at least one of the plurality of thermoelectric cooling modules.

2. The system of claim 1, further comprising:
   a reservoir, the reservoir arranged to hold the liquid, the reservoir providing the liquid to the at least one thermoelectric cooling module; and
   a wick coupled to the reservoir and the sink, the wick arranged to transfer liquid from the reservoir to the sink.

3. The system of claim 2, wherein the wick is coated with a polymer.

4. The system of claim 1, wherein:
each zone comprises a first thermoelectric module;
the electronic circuit is electrically coupled to the first thermoelectric module; and
the first thermoelectric module is electrically coupled to at least one second thermoelectric module of the plurality of thermoelectric modules.

5. The system of claim 1, wherein the electronic circuit comprises a processor, the processor configured to:
determine a temperature of the second plate, the second plate situated in a first zone;
determine whether the temperature of the second plate is greater than a threshold; and
in response to determining that the temperature of the second plate is greater than a threshold, turn off power to the plurality of thermoelectric cooling modules in the first zone.

6. The system of claim 1, wherein the electronic circuit comprises a processor, the processor configured to:
receive an indication of a selected temperature;
determine an amount of power to be supplied to the plurality of thermoelectric cooling modules to achieve the temperature; and
cause the amount of power to be supplied to the plurality of thermoelectric cooling modules.

7. The system of claim 1, wherein the electronic circuit comprises a processor, the processor configured to:
receive a first indication of a first selected temperature for a first zone;
determine a first amount of power to be supplied to the plurality of thermoelectric cooling modules in the first zone to achieve the first selected temperature;
cause the first amount of power to be supplied to the plurality of thermoelectric cooling modules in the first zone;
receive a second indication of a second selected temperature for a second zone;
determine a second amount of power to be supplied to plurality of thermoelectric cooling modules in the second zone to achieve the second selected temperature; and
cause the second amount of power to be supplied to the plurality of thermoelectric cooling modules in the second zone.

8. The system of claim 1, further comprising a battery electrically coupled to the electronic circuit.

9. The system of claim 1, further comprising a wall situated between the first plate and the second plate, the wall situated around the plurality of thermoelectric elements, the wall comprising thermally insulative material.

10. A method, comprising:
electrically coupling an electronic circuit to at least one thermoelectric cooling modules arranged in at least one zone, each thermoelectric cooling module comprising:
a first plate, the first plate arranged to be thermally coupled to a first surface;
a sink, the sink arranged to be thermally coupled to an environment to provide an open system, the sink evaporating a liquid from the sink to the environment;
a second plate, the second plate arranged to be thermally coupled to the sink; and
a plurality of thermoelectric elements, the plurality of thermoelectric elements coupled to the first plate and the second plate.

11. The method of claim 10, further comprising:
coupling a wick to the sink, the wick arranged to transfer liquid to the sink; and
coupling a reservoir to the wick, the reservoir arranged to hold the liquid, the reservoir providing the liquid to the at least one thermoelectric cooling module.

12. The method of claim 11, wherein the wick is coated with a polymer.

13. The method of claim 10, wherein:
each zone comprises a first thermoelectric module;
the electronic circuit is electrically coupled to the first thermoelectric module; and
the first thermoelectric module is electrically coupled to at least one second thermoelectric module of the plurality of thermoelectric modules.

14. The method of claim 10, further comprising:
determining, by a processor, a temperature of the second plate in a first zone, the processor being part of the electronic circuit;
determining, by the processor, whether the temperature of the second plate is greater than a threshold; and
in response to determining that the temperature of the second plate is greater than a threshold, turning off power to the plurality of thermoelectric cooling modules in the first zone.

15. The method of claim 10, further comprising:
receiving, by a processor, an indication of a selected a temperature, the processor being part of the electronic circuit;
determining, by the processor, an amount of power to be supplied to the plurality of thermoelectric cooling modules to achieve the temperature;
causing the amount of power to be supplied to the plurality of thermoelectric cooling modules.

16. The method of claim 10, further comprising:
receiving, by a processor, a first indication of a first selected temperature for a first zone, the processor being part of the electronic circuit;
determining, by the processor, a first amount of power to be supplied to the plurality of thermoelectric cooling modules in the first zone to achieve the first selected temperature;
causing the first amount of power to be supplied to the plurality of thermoelectric cooling modules in the first zone;
receiving, by the processor, a second indication of a second selected temperature for a second zone;
determining, by the processor, a second amount of power to be supplied to the plurality of thermoelectric cooling modules in the second zone to achieve the second selected temperature; and
causing the second amount of power to be supplied to the plurality of thermoelectric cooling modules in the second zone.

17. The method of claim 10, further comprising electrically coupling a battery to the electronic circuit.

18. The method of claim 10, further comprising coupling a wall to the first plate and the second plate, the wall situated around the plurality of thermoelectric elements, the wall comprising thermally insulative material.

19. A system, comprising:
at least one thermoelectric cooling module arranged in at least one zone, each thermoelectric cooling module comprising:
a first plate, the first plate arranged to be thermally coupled to a first surface;

a sink, the sink arranged to be thermally coupled to an environment to provide an open system, the sink evaporating a liquid from the sink to the environment;

a second plate, the second plate arranged to be thermally coupled to the sink; and a plurality of thermoelectric elements, the plurality of thermoelectric elements coupled to the first plate and the second plate;

an electronic circuit, the electronic circuit electrically coupled to at least one of the plurality of thermoelectric cooling modules;

a reservoir, the reservoir arranged to hold the liquid; and a wick coupled to the reservoir and the sink, the wick arranged to transfer liquid from the reservoir to the sink, the wick being coated with a polymer; and a battery electrically coupled to the electronic circuit.

20. The system of claim 19, further comprising a wall situated between the first plate and the second plate, the wall situated around the plurality of thermoelectric elements, the wall comprising thermally insulative material.

* * * * *